United States Patent
Herhold

(10) Patent No.: US 8,258,910 B2
(45) Date of Patent: Sep. 4, 2012

(54) PLANAR TRANSFORMER

(75) Inventor: Wolfgang Herhold, Duisburg (DE)

(73) Assignee: Krohne Messtechnik GmbH, Duisburg (DE)

( * ) Notice: Subject to any disclaimer, the term of this patent is extended or adjusted under 35 U.S.C. 154(b) by 165 days.

(21) Appl. No.: 12/705,840

(22) Filed: Feb. 15, 2010

(65) Prior Publication Data

US 2011/0140824 A1    Jun. 16, 2011

(30) Foreign Application Priority Data

Dec. 11, 2009   (DE) .......................... 10 2009 057 788

(51) Int. Cl.
*H01F 5/00*   (2006.01)
(52) U.S. Cl. ..................................................... 336/200
(58) Field of Classification Search ............... 336/65, 336/83, 178, 180–184, 200, 232, 220–223
See application file for complete search history.

(56) References Cited

U.S. PATENT DOCUMENTS

| | | | |
|---|---|---|---|
| 5,321,380 A | 6/1994 | Godek et al. | |
| 5,521,573 A | 5/1996 | Inoh et al. | |
| 6,373,736 B2 * | 4/2002 | Matsumoto et al. | 363/147 |
| 6,914,508 B2 | 7/2005 | Ferencz et al. | |
| 7,292,126 B2 | 11/2007 | So | |
| 7,932,799 B2 * | 4/2011 | Loef et al. | 336/200 |
| 2006/0038649 A1 * | 2/2006 | Mehrotra et al. | 336/83 |
| 2008/0218300 A1 * | 9/2008 | Loef et al. | 336/58 |

FOREIGN PATENT DOCUMENTS

EP      0 715 322 A1    6/1996
WO    2008/128912 A1    10/2008

* cited by examiner

*Primary Examiner* — Tuyen Nguyen
(74) *Attorney, Agent, or Firm* — Roberts Mlotkowski Safran & Cole, P.C.; David S. Safran

(57) ABSTRACT

A planar transformer suitable for intrinsically safe electronic circuits with a core, a first printed circuit board and a second printed circuit board. The first printed circuit board has a first winding and the second printed circuit board has a second winding. The planar transformer can be produced at a low cost and is compact, but is still suitable for connection to intrinsically safe operating circuits is implemented by at least one gap being asymmetrically split on the first printed circuit board and the second printed circuit board.

11 Claims, 3 Drawing Sheets

PLANAR TRANSFORMER

BACKGROUND OF THE INVENTION

1. Field of Invention

The invention relates to a planar transformer with a core, a first printed circuit board and a second printed circuit board, wherein the first printed circuit board has a first winding and the second printed circuit board has a second winding and the planar transformer is suitable for intrinsically safe electronic circuits.

2. Description of Related Art

Regulations for the construction and testing of intrinsically safe operating means, which are intended for use in areas in danger of gas explosions, as well as for related operating means, which are intended for the connection to intrinsically safe electronic circuits that lead into such areas, are specified by the standard EN 60079-11. This standard is also valid for electric operating means or parts of electric operating means, which are found outside of the area in danger of gas explosions or are protected by another type of ignition protection according to IEC 60079-0, insofar as the intrinsic safety of the of the electronic circuits can be dependent on the construction and design of this electric operating means or on parts of this operating means in the area in danger of gas explosions.

The type of protection "intrinsic safety" is based on the limitation of electric energy within operating means and connecting cables, which are subjected to an explosive atmosphere at a level below which ignition can be caused either by sparking or heating.

An essential requirement, which results from this standard, is the compliance of separation gaps between conductive parts of intrinsically safe and non-intrinsically safe electronic circuits, different intrinsically safe electronic circuits and an intrinsically safe electronic circuit and grounded or insulated metallic parts. The separation gap is understood here as the shortest gap between two conductive parts. Furthermore, a distinction results according to the medium, through which the path of the shortest gap leads, and correspondingly, different separation gaps result for air gaps, gaps in grouting, gaps through firm insulation, creepage distances in air and creepage distances under a protective layer. Subsequently, the compliance of these separation gaps depends on the maximum occurring voltage between the conductive parts.

A stipulated separation gap can also be composed of multiple sections added together. Sections which are smaller than one third of the respective separation gap for this medium are seen as non-countable short circuit failures, insofar as the intrinsic safety is compromised. Sections, which are greater than or equal to one third of the respective separation gap, are seen as countable short circuit failures, insofar as the intrinsic safety is thereby compromised.

The importance of the distinction in countable and non-countable short circuit failures lies in up to two countable short circuit failures being used in the evaluation of intrinsic safety, plus the non-countable short circuit failures, which yield the most unfavorable conditions.

Furthermore, the sections can also run through another medium. Here, an additive composition occurs at an equivalent separation gap by a hypothetical single medium using fixed weighting factors. Observance may find only sections here that do not lie below one third of the corresponding separation gap.

U.S. Pat. No. 5,321,380 describes a planar transformer having a first printed circuit board and at least one planar magnetic element thereupon. The planar magnetic element includes a first transformer winding and a magnet core, which extends through an opening of the first printed circuit board and is surrounded by a first transformer winding. A second transformer winding is arranged on a second printed circuit board, which also has an opening through which the magnet core extends.

A planar, intrinsically safe transformer is known from European Patent Application EP 0 715 322 B1, in which every layer of a multilayer board has a transformer winding on at least one side and at least one of the layers of the multilayer board has a transformer winding on both sides; an additional insulation layer being arranged between every pair of neighboring transformer windings. At least one part of each transformer winding is surrounded here by a magnet core. In particular, each of the first layers, which have a transformer winding on each side, has the same thickness.

Due to the normative specifications regarding separation gaps to be kept, the printed circuit boards used in the prior art have a layer thickness which directly corresponds to the specified separation gaps. The printed circuit boards required for this, having exceptionally large layer thicknesses, however, are excessively costly and result in large construction heights of the transformers.

SUMMARY OF THE INVENTION

Thus, it is a primary object of the invention to provide a planar transformer, which can be produced at a low cost and is compact, but is still suitable for the connection to intrinsically safe electronic circuits.

The above object is met based on the planar transformer described in the introduction in that at least one separation gap is asymmetrically split on the first printed circuit board and the second printed circuit board. Using this asymmetrical splitting of at least one separation gap, the first printed circuit board in respect to this separation gap or separation gaps can be implemented in a manner that corresponds as much as possible to the usual constructional size in this field of technology. The use of usual constructional size has the advantage that this can usually be produced considerably less expensively than constructional sizes that differ from this, so that the costs for production of the first printed circuit board are drastically reduced and only the second printed circuit board possibly has an unusual constructional size. It is advantageous when the asymmetric splitting is chosen in such a manner that a minimum cost results through the resulting constructional size of both printed circuit boards.

When speaking of constructional size, all measurements and constructional measures of a printed circuit board are meant. This includes, in particular, the arrangement of parts and conducting paths on the printed circuit board, the outer measurements of the printed circuit board, but also the measurements of the two printed circuit boards in relation to one another.

Basically, the separation gaps can be split according to standards, as explained in the introduction, onto an unlimited number of sections. In the spirit of the invention, the asymmetrical splitting is to occur in such a manner that as few as possible, preferably no sections arise that are to be seen as non-countable short circuit failures. No non-countable short circuit failures can only arise with a splitting of up to three sections. This means that, basically, a splitting of three sections is also in the spirit of the invention. Using the inventive avoidance of non-countable short circuit failures, not only is a simple and thus low-cost construction of the planar transformer achieved by avoiding excessive sections, but the planar transformer is also kept as compact as possible in design, especially has a low constructional height.

The planar transformer according to the invention is characterized, in particular, in that it is suitable as a part of a DC/DC converter for intrinsically safe separation according to EN 60079-11 for devices of the process industry.

According to an advantageous development of the invention, it is provided that at least one third of the separation gap passing through the first printed circuit board and the second printed circuit board between the first winding and the second winding is provided on the first printed circuit board. As already described, it results from EN 60079-11 that a separation gap is to be kept between the first winding and the second winding of the planar transformer. This separation gap, in particular, must also be kept through the firm insulation, which is formed by the first printed circuit board and the second printed circuit board. It is achieved in that, according to the previously described design, at least one third of the separation gap passing through the first printed circuit board and the second printed circuit board between the first winding and the second winding is provided on the first printed circuit board, that the first section of the separation gap passing through the first printed circuit board is to be classified as countable short circuit failure. The part of the first printed circuit board, which forms the first section of the separation gap through the first printed circuit board, can then have another, in particular, thinner thickness than the part of the second printed circuit board, which forms the second section of the separation gap through the second printed circuit board. Therefore, it is sufficient when the second section, which is accounted for through the second printed circuit board, makes up at the most two thirds of the entire specified separation gap.

According to an advantageous development of the invention, it is provided that at least two thirds of the separation gap passing through the first printed circuit board and the second printed circuit board between the first winding and the second winding is provided on the first printed circuit board. This corresponds to a splitting of the sections of one third of the specified separation gap on the first printed circuit board and two thirds of the specified separation gap on the second printed circuit board. Using this implementation on the borders of the normative limitations and the avoidance of non-countable short circuit failures, a low as possible constructional height of the planar transformer is achieved and the first printed circuit board can be formed by a usual and low-cost standard printed circuit board in the ideal case.

According to an advantageous development of the invention, it is provided that at least one third of the separation gap including the core between the first winding and the second winding is provided on the first printed circuit board. As previously stated, it ensues from EN 60079-11 that a separation gap is to be kept between the first winding and the second winding of the planar transformer. This separation gap must, in particular, also exist when the core for the separation is to be seen as conductive. This means that the first winding and the second winding of the planar transformer with inclusion of the core have to have a separation gap between one another. This separation gap depends, in respect to the comments in the introduction on the medium or the media through which this separation gap is formed. It is achieved in that at least one third of the separation gap including the core between the first winding and the second winding is provided on the first printed circuit board, that the first section of the separation gap, which is provided on the first printed circuit board, is to be classified as countable short circuit failure. Therefore, it is sufficient when the second section, which is provided on the second printed circuit board, makes up at the most two thirds of the entire specified separation gap.

According to an advantageous development of the invention, it is provided that two thirds of the separation gap including the core between the first winding and the second winding is provided on the second printed circuit board. This corresponds to a splitting of the sections of one third of the specified separation gap on the first printed circuit board and two thirds of the specified separation gap on the second printed circuit board.

According to a further advantageous development of the invention, it is provided that at least one third of the separation gap including the core between conductive parts of the first printed circuit board and conductive parts of the second printed circuit board is provided on the first printed circuit board. It also results from EN 60079-11 that between conductive parts of intrinsically safe and non-intrinsically safe electronic circuits separation gaps are to be kept. This means that between conductive parts of the first printed circuit board, e.g., the non-intrinsically safe electronic circuit, and parts of the second printed circuit board, e.g., part of an intrinsically safe electronic circuit, a separation gap is to be kept. This separation gap must also exist, in particular when the core for the separation is to be seen as conductive. This separation gap depends, in respect to the comments in the introduction on the medium or the media through which this separation gap is formed. It is achieved in that at least one third of the separation gap including the core between the first winding and the second winding is provided on the first printed circuit board, that the first section of the separation gap, which is provided on the first printed circuit board, is to be classified as countable short circuit failure. Therefore, it is sufficient when the second section, which is provided on the second printed circuit board, makes up at the most two thirds of the entire specified separation gap.

According to a preferred development of the invention, it is provided that two thirds of the separation gap including the core between the conductive parts of the first printed circuit board and conductive parts of the second printed circuit board is provided on the second printed circuit board. This corresponds to a splitting of the sections of one third of the specified separation gap on the first printed circuit board and two thirds of the specified separation gap on the second printed circuit board.

According to a further preferred development of the invention, it is provided that the separation gaps are asymmetrically split on the first printed circuit board and the second printed circuit board with one third of each separation gap provided on the first printed circuit board and two thirds of each separation gap provided on the second printed circuit board. This development of the invention has been shown to be particularly advantageous since it uses the advantages achieved by exhausting the normative limitations and by avoiding non-countable short circuit failures, such as, e.g., a compact design and the use of usual and low-cost standard printed circuit boards, for all separation gaps. In particular, a modularization of the planar transformer can be achieved particularly easily thereby, in the first printed circuit board being produced as a standard module and combined with the second printed circuit board, which has a design as specialized module adapted to different specific requirements. Using the modularization, a plurality of differing planar transformers can be produced at a low cost.

According to an advantageous development of the invention, it is provided that at least one of the first printed circuit board and the second printed circuit board is a multi-layer printed circuit board. Multi-layer printed circuit boards have the particular advantage that parts of planar transformers can be implemented within the multi-layer printed circuit board.

As a result, the parts are particularly protected and parts of the multi-layer can be used as separation gaps to be kept by the sections.

According to a further advantageous development of the invention, it is provided that the first winding is arranged within the first printed circuit board and/or the second winding is arranged within the second printed circuit board. In particular, the arrangement of the first winding within the first printed circuit board and simultaneously the second winding within the second printed circuit board has been shown to be advantageous since this arrangement is characterized by a large stability and the production of such an arrangement can be carried out at a low cost, in particular when the design of the first printed circuit board and the second printed circuit board are similar. Additionally, single layers of the multi-layer printed circuit board can be used hereby as separation gaps to be kept by the sections.

According to an additional advantageous development of the invention, it is provided that the contact of at least one winding occurs by a buried via. Using this type of contact a safe and protected conductive connection can be achieved between a winding arranged within a printed circuit board and a contact element in another lateral position found within the printed circuit board. Preferably, this via also corresponds to the requirements of EN 60079-11.

According to an advantageous development of the invention, it is provided that the first printed circuit board and the second printed circuit board together form a two-switch forward converter.

In a preferred design of the invention, it is provided that the core is formed of two subcomponents. These subcomponents can also by asymmetrically designed, are designed preferably identically, so that no unnecessary costs arise for the production of differing subcomponents. Normally, the core of the planar transformer consists of two essentially e-shaped half-shells.

According to an advantageous development of the invention, it is provided that the first printed circuit board and/or the second printed circuit board has or have at least one opening, through which the core extends. This allows for the arrangement of the first winding and the second winding on one shared core, which substantially improves the efficiency of the planar transformer. In the case that the core consists of two essentially e-shaped half-shells, it is advantageous when the first printed circuit board and the second printed circuit board each have three openings, through which the limbs of the e-shaped half-shell can extend. In particular, it is provided that opposing limbs of the e-shaped half-shell touch each other at their ends and are glued to one another to further increase the stability of the configuration. Preferably, the first winding and the second winding are arranged over one another hereby and surround the middle limb of the e-shaped half-shells and are surrounded by both ring structures formed by the middle limb, the spine and the outer limbs of the e-shaped half-shell.

In detail, there is a plurality of possibilities for designing and further developing the planar transformer according to the invention as we apparent from the following detailed description of preferred embodiments of the invention in conjunction with the accompanying drawings.

DETAILED DESCRIPTION OF THE INVENTION

Figure 1:
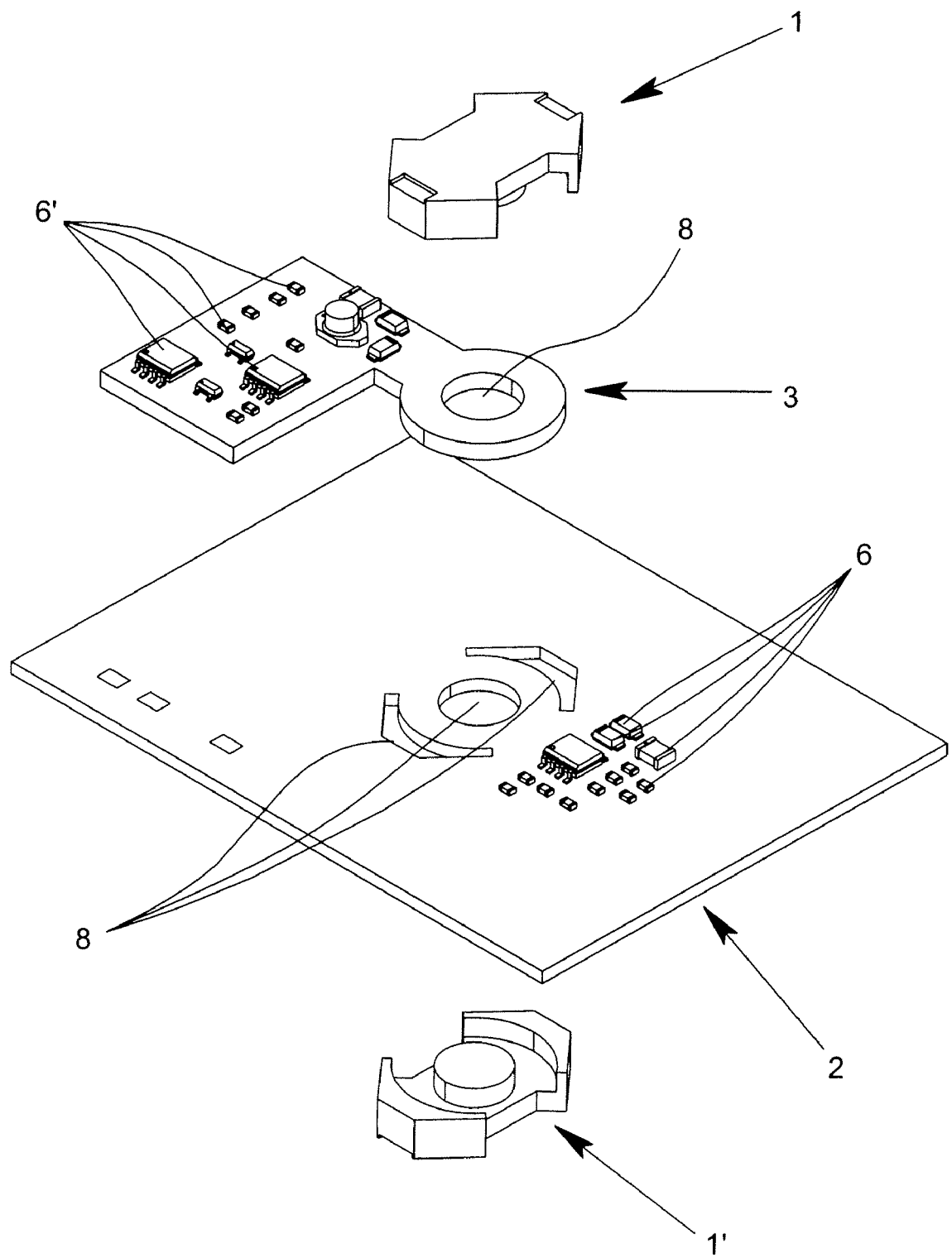
FIG. 1 is an exploded schematic view of a planar transformer according to a preferred embodiment.
Figure 2:
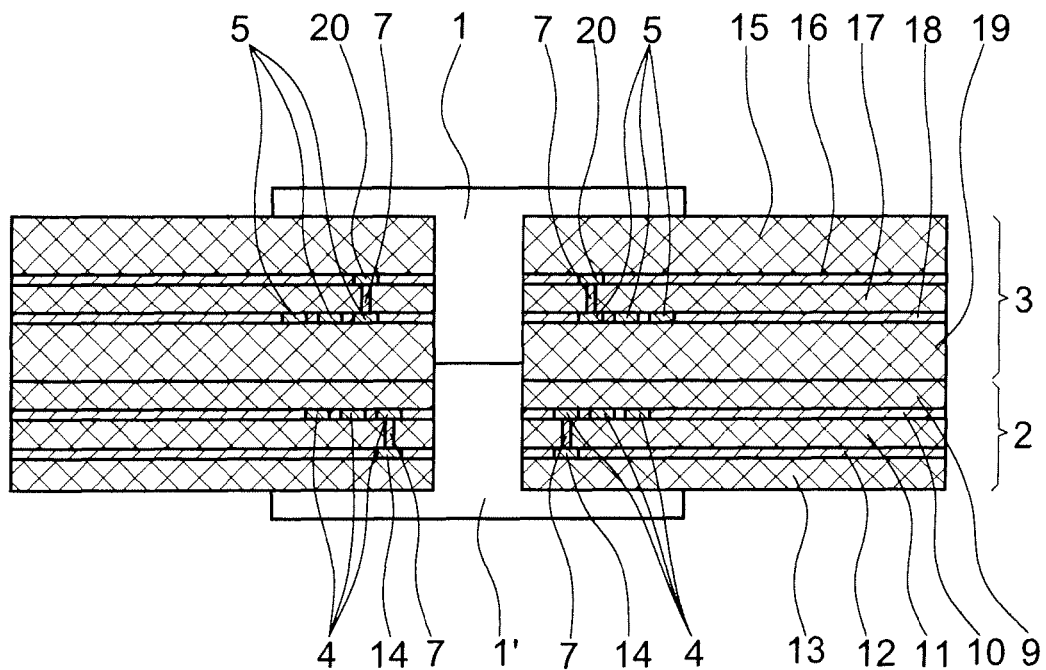
FIG. 2 is a sectional view of the core and the printed circuit board structure present in the area of the core.
Figure 3:
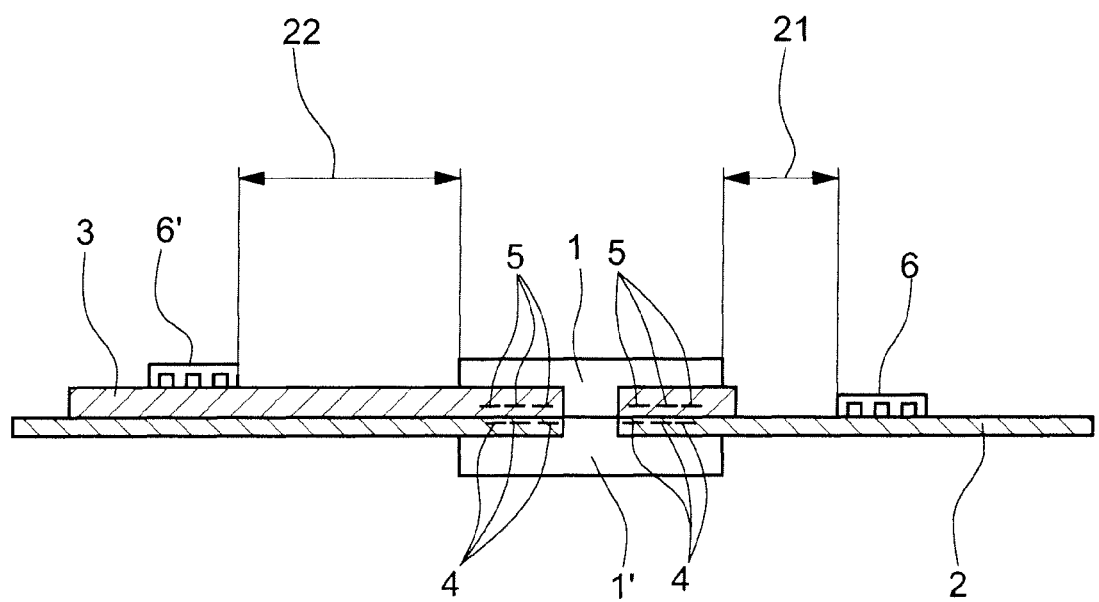
FIG. 3 is a sectional view of the core and the first and second printed circuit boards.

FIG. 1 shows a planar transformer according to the invention having a core 1, 1', which is formed of two subcomponents, a first printed circuit board 2 and a second printed circuit board 3. As shown in FIGS. 2 & 3, a first winding 4 is arranged on the inside of the first printed circuit board 2 and a second winding 5 is arranged on the inside of the second printed circuit board. A plurality of components 6, 6' is arranged on the first printed circuit board 2 and second printed circuit board 3. The first printed circuit board 2 has three openings 8 and the second printed circuit board 3 has one opening 8, through which the core 1, 1' formed of two E-shaped half-shells extends.

FIG. 2 schematically shows the first printed circuit board 2 and the second printed circuit board 3 in the area of the core 1, 1'. The first printed circuit board 2, as well as the second printed circuit board 3, are multi-layer printed circuit boards. The first printed circuit board 2 is, here, a standard multi-layer printed circuit board, whereas the second printed circuit board 3 is a special multi-layer printed circuit board with an increased layer thickness. The first printed circuit board has five layers 9 to 13.

The contact of the first winding 4 and of the second winding 5 occurs via buried vias 7 within the first printed circuit board 2 or the second printed circuit board 3. Within the first layer 10, there is a first winding 4, which is conductively connected to a first contact element 14 via a buried via 7. The second printed circuit board 3 is also formed of five layers, numbered 15 to 19. The second winding 5 is found within the second layer 18, which is conductively connected to a second contact element 20 by a via 7. The separation gap between the first winding 4 and the second winding 5 over the first printed circuit board 2 and the second printed circuit board 3 is formed by the first layer 9 and the second layer 19. Here, one third of the specified separation gap is provided by the first layer 9 and two thirds of the specified separation gap is provided by the second layer 19.

The separation gap between the first winding 4 and the second winding 5 over the core 1, 1' is formed by part of the first layer 10, which lies between the core 1 1' and the area of the first winding 4 closest to the core 1, 1', in combination with the part of the second layer 18, which lies between the core 1, 1' and the area of the second winding 5 closest to the core 1, 1'. One third of the specified separation gap is provided here by the first-mentioned part and two thirds of the separation gap required for complying with the specifications of intrinsic safety is provided by the second part.

It can be seen from FIG. 3 that the separation gap over the core 1, 1' between conductive components on the first printed circuit board 2—shown here by part 6—and conductive components on the second printed circuit board 3—shown here by part 6'—is asymmetrically split. Here, one third of the specified separation gap on the first section 21 is provided on the first printed circuit board 2 and two thirds of the specified separation gap on the second section 22 is provided on the second printed circuit board 3. In the present case, this separation gap is formed by air gaps and creepage distances.

What is claimed is:

1. Planar transformer suitable for intrinsically safe electronic circuits, comprising:
   a core,
   a first printed circuit board with a first winding, and
   a second printed circuit board with a second winding, wherein at least one separation is asymmetrically provided between the first printed circuit board and the second printed circuit board, wherein said at least one separation between the first and second coils is asymmetrically formed by parts of the first printed circuit board and the second printed circuit board in such a manner that at most one third of said at least one separation is formed by a layer of one of the first and second printed circuit boards with the remainder of said separation being formed by a layer of the other of said first and second printed circuit boards.

2. Planar transformer according to claim 1, wherein said at least one third of the separation passes between the first winding and the second winding and is provided on the first printed circuit board.

3. Planar transformer according to claim 1, wherein at least one third of the separation including the core between the first winding and the second winding is provided on the first printed circuit board.

4. Planar transformer according to claim 1, wherein at least one third of the separation including the core between conductive components of the first printed circuit board and conductive components of the second printed circuit board is provided on the first printed circuit board.

5. Planar transformer according to claim 1, wherein the at least one separation is a plurality of separations that are asymmetrically split on the first printed circuit board and the second printed circuit board with one third of each separation gap provided on the first printed circuit board and two thirds of each separation gap provided on the second printed circuit board.

6. Planar transformer according to claim 1, wherein at least one of the first printed circuit board and the second printed circuit board is a multi-layer printed circuit board.

7. Planar transformer according to claim 6, wherein the first winding is arranged within the first printed circuit board and/or the second winding is arranged within the second printed circuit board.

8. Planar transformer according to claim 7, wherein a contact of at least one winding occurs by a buried via.

9. Planar transformer according to claim 1, wherein the first printed circuit board and the second printed circuit board, together, form a two switch forward converter.

10. Planar transformer according to claim 1, wherein the core is formed of two separate subcomponents.

11. Planar transformer according to claim 1, wherein at least one of the first printed circuit board and the second printed circuit board have at least one opening through which the core extends.

* * * * *